Jan. 26, 1971 S. L. PLUMLEY 3,558,346

DOUBLE GLAZED CERAMIC SUBSTRATES

Filed March 27, 1968

INVENTOR.
Stewart L. Plumley
BY William J. Simmons Jr.
ATTORNEY

United States Patent Office 3,558,346
Patented Jan. 26, 1971

3,558,346

DOUBLE GLAZED CERAMIC SUBSTRATES

Stewart L. Plumley, Painted Post, N.Y., assignor to Corning Glass Works, Corning, N.Y., a corporation of New York Filed Mar. 27, 1968, Ser. No. 716,435
Int. Cl. C04b *41/12*
U.S. Cl. 117—68 14 Claims

ABSTRACT OF THE DISCLOSURE

A glazed ceramic body which is especially useful as a microcircuit substrate. The two planar surfaces of the ceramic body are coated with glazes having softening points which differ to such an extent the glazes can be applied in consecutive steps, the first applied glaze remaining unmarred during the firing of the second applied glaze.

BACKGROUND OF THE INVENTION

This invention relates to flat, glazed ceramic substrates which are especially useful as the base for microcircuits, integrated circuits and other micro-miniaturized electrical, electronic, magnetic and related components.

Circuits and components of the types listed above are often fabricated by thin film techniques. The advantages obtained by film circuitry are lower cost, higher reliability, smaller size and greater ease of manufacture as compared to conventional circuit elements. Over the past few years the number of materials used in film circuit elements has grown to include a wide variety of conductive, resistive, dielectric, semiconductive, superconductive and magnetic films, as well as various substrates and encapsulation materials. Among the most commonly used conductive films are copper, aluminum, gold, platinum, and tantalum. Resistive films include anodized tantalum, tin oxide, and others. Some important dielectric films include oxides of silicon and tantalum. Semiconductive films such as silicon, germanium, and compound semiconductors may be used. Also superconductive films such as tin and its alloys are being studied. Magnetic films incude permalloys and various special alloys.

The substrates should have properties which are compatible with the properties of the thin film materials being applied. Thus, the substrates should be able to tolerate the processing conditions required for film deposition, should have a high electrical resistivity, a low dielectric loss, good chemical durability, and a high thermal conductivity. Furthermore, the substrate should be free of impurities such as alkali ions which may adversely affect circuit performance. The smoothness required of a substrate is generally very significant. The sensitivity of films to surface roughness will, at least to some extent, depend upon the nature of the film. For example, vapor deposited thin film capacitors are quite sensitive to substrate imperfections. Uneven thickness of dielectric films and field emission from electrode irregularities lead to low breakdown voltage, especially for high value capacitors. Magnetic films are also quite sensitive to surface roughness.

A wide variety of substrate materials which have been studied includes glasses, ceramics, glazed ceramics, and in some special cases single crystals, dielectric coated metals, glass ceramics and organic polymers.

Ceramics offer some advantages which make them an important substrate material. Aside from the high softening temperatures available in ceramic materials, their principal advantages are their high thermal conductivity and their low electrical conductivity. This is particularly true for high purity alumina and beryllia. The surface roughness of ceramics in deviations from flatness depends on the manufacturing process, but it is usually in the range of 50 microinches, which is fairly rough. Careful polishing can to some extent reduce the roughness of the surface, but may leave other imperfections. It is obvious to those skilled in the art that ceramic substrates consisting of materials such as alumina, beryllia and the like have deforming temperatures that are sufficiently high as compared with the temperatures required for applying glass glazes thereto that such substrates are not adversely affected by such glazing processes.

As a result of this difficulty and in an effort to combine the thermal conductivity of ceramics with the smoothness of glass, glazed ceramic substrates have been developed. Although the expansion coefficient of a glazed ceramic substrate depends on the ceramic, the other important surface properties are determined primarily by the composition and thickness of the glaze.

Initially, ceramic substrates were glazed only on a single surface. The choice of glaze compositions was determined not only by the desired glass properties but also by the possible interactions which could occur between the glaze and the base ceramic. A mismatch in expansion coefficients, for example, may result in substrate warpage or bowing. A serious problem which arises in the forming of relatively large glazed ceramic substrates (greater than ½ inch x ½ inch and up to about 0.01 inch thick) is that during the firing of the glaze, the substrate may incur some warping and loss of flatness even when the thermal expansion coefficients of the glaze and the ceramic body are reasonably matched.

As the trend to higher component density becomes limited by available space, it has become advantageous to glaze both sides of each substrate, thereby doubling the useable area. Double glazing also tended to neutralize the substrate warping which occurred on single glazed plates. However, the use of a single glaze for both sides of the substrate introduced a problem of support during firing. Both sides of the substrate were coated with a single glaze material, and the substrate was then fired while being vertically supported on two parallel edges from which the glaze material had been removed. However, some warpage resulted from the manner in which the substrate was supported during firing. As thinner ceramic substrates were developed, the problem of warpage increased.

It was found that warpage could be minimized by supporting a substrate on one side while applying a glaze to the other side. A single glaze was used for both sides, and while the second side was being glazed and fired at the maturing temperature of the glass glaze material, the previously glazed first side became marred and deformed by contacting the refractory material substrate support during the high temperature firing operation. As used herein, the phrase "maturing temperature" means that temperature at which the glass glaze material must be held for a selected time to cause the particulated glass composition to consolidate and form a continuous, smooth, adherent glaze. Only one side of the double glazed substrate prepared in accordance with the above example was useable since one side was marred during the second firing operation.

SUMMARY OF THE INVENTION

It is therefore an object of this invention to provide a double glazed ceramic substrate having two useable surfaces.

A further object of this invention is to provide a glazed ceramic substrate having a minimum of warpage.

Another object of this invention is to provide an improved double glazed ceramic body for use as a substrate for film circuitry.

Still another object of this invention is to provide an improved method for glazing the two planar surfaces of a ceramic substrate.

Briefly, the double glazed substrate of this invention is formed in accordance with the following method. A first surface of a ceramic substrate having first and second opposed planar surfaces is coated with a first glass glaze material. The substrate is then heated to a maturing temperature which is sufficient to cause the first glaze material to consolidate and form a continuous, smooth, adherent glaze. The second planar surface of the substrate is then coated with a second glass glaze material having a softening point which is lower than the maturing temperature of the first glaze material. The substrate is heated to a maturing temperature which is lower than the softening point of the first glass glaze and which is sufficient to cause the second glaze material to consolidate and form a continuous, smooth, adherent glaze.

After the substrate has cooled, both sides thereof may be utilized for receiving film microcircuitry. Substrate warpage is minimized because the two glazes are applied in consecutive steps, thus permitting the substrate to be adequately supported on a planar refractory support during each of the two firing operations. In accordance with this invention the two glazes can be consecutively applied only if the maturing temperature of the second glaze is below the temperature at which the first glaze will deform or become marred. In general, the first glaze will not deform or become marred if the maturing temperature of the second glaze is lower than the softening point of the first applied glaze.

The above and still further objects, features and advantages of the present invention will become apparent upon consideration of the following detailed description taken in conjunction with the accompanying drawing.

DETAILED DESCRIPTION

Figure 1:
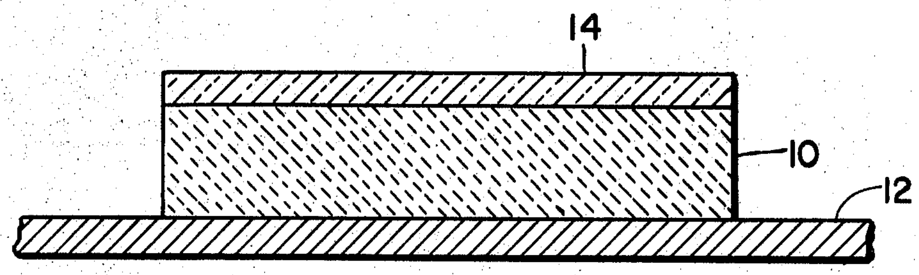
FIGS. 1 and 2 are cross-sectional views showing successive stages in the manufacture of a glazed substrate in accordance with this invention.

In accordance with the present invention the two planar surfaces of a ceramic substrate are glazed in successive stages the softening point of the first applied glaze being higher than the maturing temperature of the second applied glaze. As shown in FIG. 1, one of the planar surfaces of a ceramic substrate 10 is supported by a flat supporting member 12 which may consist of a fibrous ceramic mat or some other similar refractory member. A suspension of particulated glass composition having a relatively high softening point is applied to the surface of the ceramic substrate 10 by any conventional technique such as spraying, brushing, silk screening, or the like. The coated substrate is then furnace fired at a maturing temperature for a period of time which is sufficient to consolidate the particulated glass coating and form a continuous, smooth, adherent glaze. The resultant glaze should be as thin as possible and yet provide a smooth surface. A glaze thickness of about 1–3 mils is usually desirable for microminiature circuit applications wherein the thickness of the ceramic substrate is about 20–40 mils.

The glass glaze compositions are prepared by conventional techniques. The glass is ground into small particles after being conventionally melted under standard conditions in a non-reactive refractory furnace. The finely divided particulated glass is then suspended in a suitable vehicle such as water, amyl acetate, alcohol, or the like, and coated on the surface of the ceramic body.

Figure 2:
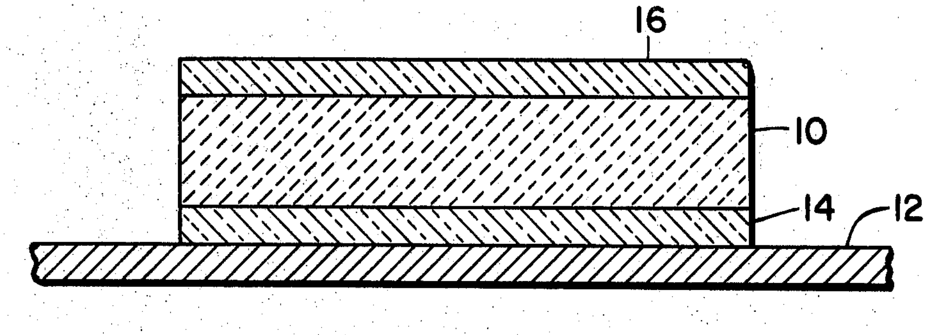

After the glaze 14 has been applied to the substrate 10, the substrate is inverted as shown in FIG. 2 so that the glazed surface 14 is supported by the member 12. A suspension of a particulated glass composition having a lower softening point than that which was used to form the glaze 14, is applied to the surface of the substrate 10 and then fired. Since the glaze 16 is fired at a maturing temperature which is lower than the softening point of the glaze 14, the surface of the glaze 14 is not marred or deformed by contacting the support member 12 during the firing of the glaze 16.

When both sides of a ceramic substrate are glazed, the expansion coefficients of the two glazes are not as critical as the expansion coefficient of a single glaze which is applied to only one side of a substrate. However, the expansion coefficients of the two glazes are preferably as close as possible to that of the substrate material. Moreover, the expansion coefficients of the glazes are preferably not more than about 0.5 part per million above that of the substrate since the glaze would be put into a state of tension and thereby be weakened if the expansion coefficients of the glaze exceeded that of the substrate. However, the expansion coefficients of the glazes may be somewhat less than that of the substrate since this relationship would result in a strengthening of the glaze which would be in a state of compression.

The invention is further illustrated by the following examples.

Example I

Glass compositions suitable for use as the glazes 14 and 16 were prepared and melted in accordance with the formulations set forth in the table below, wherein the percentages of the constituent parts are set forth as calculated from the glass batches in weight percent on the oxide basis:

TABLE I

| | First applied glaze 14 | Second applied glaze 16 |
|---|---|---|
| Oxide: | | |
| $SiO_2$ | 58 | 44 |
| $Al_2O_3$ | 15 | 7 |
| CaO | 10 | |
| MgO | 7 | |
| BaO | 6 | |
| $B_2O_3$ | 4 | 17 |
| PbO | | 27 |
| ZnO | | 5 |

The batch materials were weighed and then mixed by ball milling. The mixed batches were melted in platinum crucibles, and the molten glasses were rolled into thin sheets, crushed and screened to 325 mesh U.S. standard size. The pertinent properties of the glasses are summarized as follows:

TABLE II.—PROPERTIES OF THE GLAZES DEFINED IN TABLE I

| | First applied glaze 14 | Second applied glaze 16 |
|---|---|---|
| Softening point, ° C. | 910 | 714 |
| Expansion coefficient $\times 10^{-7}$/° C., 0°–300° C. | 46 | 38 |

A high alumina content ceramic body was disposed on a flat fibrous ceramic mat. Powdered glass prepared from the glass composition listed in Table I as glaze 14 was mixed with a suspending medium of amyl acetate and then sprayed into one surface of the alumina body. The coated body was then heated to 1400° C. for twenty minutes to consolidate the particulated glass composition and cause it to form a continuous, smooth, adherent glaze on the surface of the alumina body. The body was cooled and was then inverted so that the glazed surface was supported by the fibrous ceramic mat.

Powdered glass listed in Table I as glaze 16 was then mixed with amyl acetate and was sprayed on the remaining planar surface of the alumina substrate. The alumina body was heated to 820° C. for ten minutes and thereafter cooled rapidly. Both sides of the double glazed ceramic body thus prepared could be used as surfaces for the deposition of microcircuits. Since the second applied glaze was fired at a maturing temperature which is lower than the softening point of the first applied glaze, the first applied glaze was not marred by the subsequent firing operation. Furthermore, even though the expansion coefficients of the two glazes differ from each other and from that of the alumina substrate, which has an expansion coefficient of $70 \times 10^{-7}/°$ C., it was found that the double glazed ceramic body exhibited little warpage.

Following the procedure of Example I, other alkali-free glass glaze compositions may be prepared and applied to a ceramic substrate. The formulations of some additional glaze compositions are set forth in the table below, wherein the percentages of the constituent parts are set forth as calculated from the glass batches in weight percent on the oxide basis.

TABLE III

| | Glass designation | | | | |
|---|---|---|---|---|---|
| | A | B | C | D | E |
| Oxide: | | | | | |
| $SiO_2$ | 62 | 46 | 45 | 5 | 5 |
| $Al_2O_3$ | 15 | 3 | 10 | 1 | 1 |
| BaO | 6 | 27 | 30 | | |
| CaO | (1) | 3 | 5 | | |
| MgO | (1) | | | | |
| $B_2O_3$ | | 1 | 9 | 14 | 9 |
| $La_2O_3$ | | 20 | | | |
| $As_2O_3$ | | | 1 | | |
| PbO | | | | 45 | 60 |
| Zno | | | | 35 | 25 |

[1] In Example A the combined percentage of CaO and MgO is 17.

The pertinent properties of the glasses of Table III are sumarized as follows:

TABLE IV.—PROPERTIES OF THE GLAZES DEFINED IN TABLE III

| | Softening point, ° C. | Expansion coefficient $\times 10^{-7}/°$ C. |
|---|---|---|
| Glaze: | | |
| A | 950 | 45 |
| B | 900 | 70 |
| C | 823 | 60 |
| D | 498 | 59 |
| E | 440 | 73 |

Since glazes A, B and C have relatively high softening points, any one of them could be substituted for the first applied glaze 14 of Example I. Similarly, either of the glazes D and E could be substituted for the second applied glaze 16 since their softening points are relatively low. Approximate expansion matching of the pairs of glazes would be desirable. One of the glazes A, B or C could be applied to a first side of a substrate and fired at some maturing temperature which is above its softening point for a time which is sufficient to cause the particulated glass composition to consolidate and form a smooth, continuous adherent glaze. Thereafter, one of the glazes D or E could be applied to the other side of the substrate and fired at a maturing temperature which is above its softening point but which is below the softening point of the first applied glaze. The surface of the first applied glaze will not become marred as long as the maturing temperature of the second applied glaze is lower than the softening point of the first applied glaze. Furthermore, any combination of the above disclosed first and second applied glazes should result in smoothly glazed substrates having a minimum of warpage.

It is not intended that this invention be limited by the specific glass glaze compositions set forth in Tables I and III, these compositions merely being set forth by way of example to permit those skilled in the art to more readily practice this invention.

I claim:

1. An improved ceramic body of the type which includes a ceramic substrate having at least two planar opposed surfaces, each of said planar surfaces being coated with a glass glaze, said glazes being characterized in that the maturing temperature of one of said glazes is lower than the softening point of the other of said glazes, the coefficients of expansion of said glazes being less than 0.5 part per million above that of said substrate, and the maturing temperatures of said glazes being below the deformation temperature of said substrate.

2. A ceramic body in accordance with claim 1 wherein said substrate consists essentially of alumina.

3. A ceramic body in accordance with claim 1 wherein the thickness of each of said glazes is between 1 and 3 mils.

4. A ceramic body in accordance with claim 1 wherein said glazes are substantially alkali-free.

5. An improved glazed ceramic body comprising a ceramic substrate having first and second planar surfaces, a first glass glaze disposed on said first planar surface, a second glass glaze disposed on said second planar surface, the maturing temperature of said second glaze being lower than the softening point of said first glaze, the coefficients of expansion of said glazes being less than 0.5 part per million above that of said substrate, and the maturing temperatures of said glazes being below the deformation temperature of said substrate.

6. A ceramic body in accordance with claim 5 wherein said ceramic substrate consists essentially of alumina.

7. A ceramic body in accordance with claim 6 wherein said first and second glass glazes are substantially alkali-free.

8. A method of glazing a ceramic substrate comprising the following steps providing a ceramic substrate having first and second opposed planar surfaces.

applying to said first planar surface a layer of a first glass glaze material in particulate form, the maturing temperature of said first glaze material being below the deformation temperature of said substrate, heating the assembly so formed to a maturing temperature which is sufficient to cause said first glaze material to consolidate and form a continuous, smooth, adherent glaze, applying to said second planar surface a layer of a second glass glaze material in particulate form, the maturing temperature of said second glaze material being lower than the softening point of said first glaze material and lower than the deformation temperature of said substrate, heating the assembly so formed to a maturing temperature which is lower than the softening point of said first glass glaze and which is sufficient to cause said second glaze material to consolidate and form a continuous, smooth, adherent coating, and cooling said assembly.

9. A method in accordance with claim 8 which further includes, prior to the step of applying a layer of said first glass glaze material, the step of supporting said substrate on said second planar surface, and prior to the step of applying a layer of said second glass glaze material, the step of inverting said assembly so that it is supported on its glazed surface.

10. A method in accordance with claim 9 which further includes, prior to the step of inverting said assembly, the step of cooling said assembly to a temperature which is below the softening point of said first glass glaze material.

11. A method in accordance with claim 10 wherein said ceramic substrate consists essentially of alumina.

12. A method in accordance with claim 11 wherein said first and second glass glaze materials are substantially alkali-free.

13. A method of glazing a ceramic substrate comprising the following steps providing a ceramic substrate having first and second opposed planar surfaces, supporting said substrate on said second planar surface, providing a first glass glaze composition in particulate form, the maturing temperature of said first glaze composition being below the deformation temperature of said substrate, suspending said first glass glaze composition in a suitable vehicle, spraying on said first planar surface a layer of the suspension so formed, heating the assembly so formed to a maturing temperature which is sufficient to cause said first glaze material to consolidate and form a continuous, smooth, adherent glaze, cooling said substrate to a temperature which is below the softening point of said first glass glaze, inverting said assembly so that it is supported on its glazed surface, providing a second glass glaze composition in particulate form, the maturing temperature of said second glaze material being lower than the softening point of said first glaze material and lower than the deformation temperature of said substrate, suspending said second glaze material in a suitable vehicle, spraying on said second planar surface a layer of said second glaze suspension, heating the assembly so formed to a maturing temperature which is lower than the softening point of said first glass glaze and which is sufficient to cause said second glaze material to consolidate and form a continuous, smooth, adherent coating, and cooling said assembly.

14. A ceramic body in accordance with claim 5 wherein the thickness of each of said glazes is between 1 and 3 mils.

References Cited

UNITED STATES PATENTS

| | | | |
|---|---|---|---|
| 2,292,369 | 8/1942 | Gordon | 117—123X |
| 2,694,016 | 11/1954 | Craven et al. | 117—123X |
| 2,887,144 | 3/1959 | Iversen | 117—70X |

ALFRED L. LEAVITT, Primary Examiner

W. F. CYRON, Assistant Examiner

U.S. Cl. X.R.

117—123, 124, 169